United States Patent
Lee et al.

(10) Patent No.: US 10,622,533 B2
(45) Date of Patent: Apr. 14, 2020

(54) METAL PASTE AND THERMOELECTRIC MODULE

(71) Applicant: LG CHEM, LTD., Seoul (KR)

(72) Inventors: Dae Ki Lee, Daejeon (KR); Dong-Sik Kim, Daejeon (KR); Cheol-Hee Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

(21) Appl. No.: 15/766,167

(22) PCT Filed: Dec. 1, 2016

(86) PCT No.: PCT/KR2016/014056
§ 371 (c)(1),
(2) Date: Apr. 5, 2018

(87) PCT Pub. No.: WO2017/105011
PCT Pub. Date: Jun. 22, 2017

(65) Prior Publication Data
US 2018/0287032 A1    Oct. 4, 2018

(30) Foreign Application Priority Data

Dec. 15, 2015 (KR) .................. 10-2015-0179577
Oct. 4, 2016 (KR) .................. 10-2016-0127765

(51) Int. Cl.
| H01B 1/00 | (2006.01) |
| B23K 35/00 | (2006.01) |
| H01L 35/08 | (2006.01) |
| H01B 1/22 | (2006.01) |
| B23K 35/36 | (2006.01) |
| B23K 35/26 | (2006.01) |
| B23K 35/28 | (2006.01) |

(Continued)

(52) U.S. Cl.
CPC .......... *H01L 35/08* (2013.01); *B23K 35/025* (2013.01); *B23K 35/0244* (2013.01); *B23K 35/262* (2013.01); *B23K 35/264* (2013.01); *B23K 35/282* (2013.01); *B23K 35/3033* (2013.01); *B23K 35/3601* (2013.01); *B23K 35/3603* (2013.01); *B23K 35/3618* (2013.01); *H01B 1/22* (2013.01)

(58) Field of Classification Search
CPC .... H01B 1/00; H01B 1/02; H01B 1/22; H01L 2924/013; B23K 351/22
See application file for complete search history.

(56) References Cited

U.S. PATENT DOCUMENTS

| 8,882,934 B2 | 11/2014 | Nakagawa et al. |
| 9,610,655 B2 | 4/2017 | Hwang |

(Continued)

FOREIGN PATENT DOCUMENTS

| CN | 104741821 A | 7/2015 |
| EP | 2799164 A1 | 11/2014 |

(Continued)

*Primary Examiner* — Mark Kopec
(74) *Attorney, Agent, or Firm* — Dentons US LLP (57) ABSTRACT

The present invention relates to a metal paste including: a first metal powder including nickel (Ni); a second metal powder including at least one selected from the group consisting of tin (Sn), zinc (Zn), bismuth (Bi), and indium (In); and a dispersing agent, and to a thermoelectric module which adopts a bonding technique using the metal paste.

10 Claims, 7 Drawing Sheets

(51) Int. Cl.
*B23K 35/02* (2006.01)
*B23K 35/30* (2006.01)

(56) References Cited

U.S. PATENT DOCUMENTS

| | | | | | |
|---|---|---|---|---|---|
| 2002/0012607 | A1* | 1/2002 | Corbin | ............... | B22F 1/0003 |
| | | | | | 420/558 |
| 2004/0251449 | A1* | 12/2004 | Yonezawa | ............... | C08K 3/08 |
| | | | | | 252/500 |
| 2009/0220812 | A1* | 9/2009 | Kato | ............... | B22F 1/0003 |
| | | | | | 428/548 |
| 2013/0233618 | A1* | 9/2013 | Nakano | ............... | B23K 35/025 |
| | | | | | 174/94 R |
| 2013/0265735 | A1* | 10/2013 | Nakatani | ............... | H01B 1/22 |
| | | | | | 361/783 |
| 2015/0239069 | A1 | 8/2015 | Nakano et al. | | |
| 2015/0246417 | A1* | 9/2015 | Zhang | ............... | B23K 35/264 |
| | | | | | 148/24 |
| 2016/0082512 | A1 | 3/2016 | Schafer et al. | | |
| 2016/0129530 | A1* | 5/2016 | Greve | ............... | B23K 35/025 |
| | | | | | 75/228 |
| 2016/0136763 | A1 | 5/2016 | Endoh et al. | | |
| 2016/0354868 | A1* | 12/2016 | Matsugi | ............... | B23K 35/26 |
| 2016/0368105 | A1* | 12/2016 | Hattori | ............... | B22F 1/00 |
| 2018/0033938 | A1 | 2/2018 | Lee et al. | | |

FOREIGN PATENT DOCUMENTS

| | | |
|---|---|---|
| JP | 2002-254195 A | 9/2002 |
| JP | 2006-339284 A | 12/2006 |
| JP | 2008-108625 A | 5/2008 |
| JP | 2009-059648 A | 3/2009 |
| JP | 4490206 B2 | 6/2010 |
| JP | 2015-004105 A | 1/2015 |
| JP | 5733610 B2 | 6/2015 |
| KR | 10-2014-0133221 A | 11/2014 |
| WO | WO-2014204013 A1 * | 12/2014 ............ B22F 1/0022 |

* cited by examiner

METAL PASTE AND THERMOELECTRIC MODULE

CROSS-REFERENCE TO RELATED APPLICATION(S)

This application is a National Stage filing under 35 U.S.C. 371 of International Application No. PCT/KR2016/014056filed on Dec. 1, 2016, and claims the benefit of priority of Korean Patent Application No. 10-2015-0179577filed with the Korean Intellectual Property Office on Dec. 15, 2015and Korean Patent Application No. 10-2016-0127765filed on Oct. 4, 2016 with the Korean Intellectual Property Office, the entire contents of which are incorporated herein by reference.

Technical Field

The present invention relates to a metal paste having excellent thermal and electrical properties and a sufficient adhesive property, and to a thermoelectric module which adopts a bonding technique using the metal paste between a thermoelectric element and an electrode.

Background Art

If there is a temperature difference between both ends of materials in a solid state, a difference in the concentration of carriers (electrons or holes) having thermal dependence occurs, leading to an electrical phenomenon called a thermal electromotive force, that is, a thermoelectric effect. As such, the thermoelectric effect means reversible and direct energy conversion of a temperature difference to an electrical voltage. The thermoelectric effect may be classified into thermoelectric power generation that produces electrical energy, and in contrast, thermoelectric cooling/heating that induces a temperature difference between both ends by electricity supply.

A thermoelectric material exhibiting the thermoelectric effect, that is, a thermoelectric semiconductor, has been extensively studied because it has the advantage of being eco-friendly and sustainable during power generation and cooling. Moreover, since the thermoelectric material is capable of directly producing power from industrial waste heat, vehicle waste heat, etc., and thus is useful for improving fuel efficiency or reducing $CO_2$, etc., the thermoelectric material has gained more and more attention.

A thermoelectric module has, as a basic unit, one pair of p-n thermoelectric elements including a p-type thermoelectric element (TE) in which holes move to transfer thermal energy, and an n-type thermoelectric element in which electrons move to transfer thermal energy. Further, the thermoelectric module may include an electrode that connects the p-type thermoelectric element and the n-type thermoelectric element.

In the case of a conventional thermoelectric module, soldering has been widely used to bond an electrode with a thermoelectric element. Conventionally, the electrode and the thermoelectric element are generally bonded using, for example, a Sn-based solder paste or a Pb-based solder paste.

However, such a solder paste has a limitation in driving a thermoelectric module in a high-temperature condition because of its low melting point. For example, it may be difficult to drive a thermoelectric module using an Sn-based solder paste for bonding a thermoelectric element and an electrode at a temperature of 200° C. or higher. Further, it may be difficult to drive a thermoelectric module using a Pb-based solder paste at a temperature of 300° C. or higher.

Accordingly, there is a need to develop a novel bonding material having excellent thermal and electrical properties so that a thermoelectric module can be stably driven at a temperature of 300° C. or higher.

DETAILED DESCRIPTION OF THE INVENTION

Technical Problem

The present invention provides a metal paste having excellent thermal and electrical properties and sufficient adhesive properties.

The present invention also provides a thermoelectric module which adopts a bonding technique using the metal paste between a thermoelectric element and an electrode.

Technical Solution

The present invention provides a metal paste including: a first metal powder including nickel (Ni); a second metal powder including at least one selected from the group consisting of tin (Sn), zinc (Zn), bismuth (Bi), and indium (In); and a dispersing agent.

thermoelectric elements including a thermoelectric semiconductor; an electrode which is composed of a metal material and is connected between the thermoelectric elements; and a bonding layer in which the metal paste is sintered to bond the thermoelectric elements and the electrode.

Hereinafter, the metal paste and the thermoelectric module according to specific embodiments of the present invention will be described in detail.

According to one embodiment of the present invention, a metal paste including a first metal powder including nickel (Ni); a second metal powder including at least one selected from the group consisting of tin (Sn), zinc (Zn), bismuth (Bi), and indium (In); and a dispersing agent, may be provided.

The present inventors realized that solder pastes conventionally used for bonding an electrode and a thermoelectric element have a limitation in driving a thermoelectric module under a high-temperature condition because of its low melting point, and carried out studies on a novel bonding material having excellent thermal and electrical properties so that the thermoelectric module can be stably driven at a temperature of 300° C. or higher.

Accordingly, it has been found through the experiments that a metal paste including a high-melting point metal powder, a low-melting point metal powder, and a dispersing agent can impart sufficient adhesive properties between a thermoelectric element and an electrode while having excellent thermal and electrical properties, thereby completing the present invention.

In general, a binder resin is added to improve dispersibility of a metal powder and to improve wettability of a paste during manufacture of a solder paste. Further, since the binder resin has a decomposition temperature of about 350° C. or higher, it may remain in the form of residual carbon in the bonding layer even after the bonding process at about 350° C. to 450° C. This residual carbon disturbs the aggregation between metal particles, and ultimately deteriorates sinterability of the metal, which may deteriorate the bonding strength and the electrical/thermal properties of the bonding layer.

However, since the metal paste of one embodiment uses the high-melting point metal powder and the low-melting point metal powder together as described above, it exhibits not only excellent dispersibility of metal powders, but also excellent bonding strength and electrical/thermal properties, even though it does not contain a binder resin.

Further, as the metal paste does not contain a binder resin, it does not need to undergo a thermal decomposition process of a resin, thereby providing a more free bonding environment during the bonding process, and in particular, the bonding process may be carried out even in a low-temperature environment of 300° C. to 400° C.

More specifically, the metal paste of one embodiment includes a first metal powder including nickel (Ni), and a second metal powder including at least one selected from the group consisting of tin (Sn), zinc (Zn), bismuth (Bi), and indium (In). Further, the first metal powder may include at least one selected from the group consisting of copper (Cu), iron (Fe), and silver (Ag) in addition to nickel (Ni).

Herein, the first metal powder is a high-melting point metal having a melting point of about 900° C. or higher, and the second metal powder is a low-melting point metal having a melting point of about 500° C. or lower. As the metal paste includes both the first metal powder and the second metal powder, an intermetallic compound bonding layer composed of the first and second metal powders may be formed at a relatively low temperature.

More specifically, as the metal paste of one embodiment includes both the high-melting point and low-melting point metal powders, the flowability of the second metal is enhanced in an environment having a temperature of equal to or higher than the melting point of the second metal powder, which significantly increases the diffusibility of the first and second metals, thereby facilitating the formation of intermetallic compounds due to an intermetallic reaction and the sintering reaction (densification). The intermetallic compound bonding layer formed through these processes has high electrical conductivity and thermal conductivity due to the properties of the first and second metals, and high heat resistance due to the properties of the first metal, and thus can function as a high temperature bonding layer which effectively connects the thermoelectric element and the electrode.

In addition, the first metal powder may have an average particle diameter of 10 μm or less, preferably 0.1 μm to 3 μm, and more preferably 0.3 μm to 3 μm. Further, the second metal powder may have an average particle diameter of 10 μm or less, preferably 0.5 μm to 10 μm, and more preferably 1 μm to 10 μm.

When the average particle diameter of the first and second metal powders satisfies the above-described range, it is preferable because the degree of oxidation of the metal powders can be lowered, and the intermetallic compound forming the reaction and the degree of sintering can be improved by an appropriate specific surface area.

Further, the weight ratio between a first metal powder and a second metal powder may be about 15:85 to about 90:10, and preferably about 20:80 to about 35:65.

The metal paste may further include a dispersing agent in addition to the first metal powder and the second metal powder.

The dispersing agent plays a role in improving dispersibility in solvents of the first and second metal powders in the metal paste of one embodiment not including a binder resin, and it may exist by being adsorbed on the surface of the first metal powder and the second metal powder.

The dispersing agent may be an alkali metal salt or an alkaline earth metal salt of an aliphatic acid having 12 to 20 carbon atoms. More specifically, it may be sodium stearate, stearic acid, oleic acid, oleylamine, palmitic acid, dodecanoic acid, sodium dodecanoate, and isostearic acid.

Further, the dispersing agent may be contained in an amount of about 0.1% by weight to 5% by weight, and preferably about 0.5% by weight to 1.5% by weight, based on the total weight of the metal paste.

In addition, the metal paste of one embodiment may further include a solvent having a boiling point of 150° C. to 350° C.

The solvent imparts wettability to the metal paste and serves as a vehicle for bearing the first and the second metal powders. In particular, since the boiling point of the solvent is 150° C. to 350° C., a drying process and bonding process can be carried out at a low temperature of less than 350° C.

Further, the solvent may include at least one selected from the group consisting of alcohols, carbonates, acetates, and polyols, and more specifically, it may be dodecanol, propylene carbonate, diethylene glycol monoethyl acetate, tetrahydrofurfuryl alcohol, terpineol, dihydro terpineol, ethylene glycol, glycerin, tridecanol, or isotridecanol.

The solvent may be contained in an amount of about 1% by weight to 10% by weight, and preferably about 3% by weight to 10% by weight, based on the total weight of the metal paste.

The metal paste of one embodiment may further include a sintering-inducing additive.

The sintering-inducing additive serves to reduce an oxidized layer of the metal surface in the paste, to induce the initiation of a synthesis reaction, to assist thermal decomposition of a carbon-based dispersing agent, etc., in order to induce and promote the formation and sintering of the intermetallic compound. Thus, the metal paste including the same can form a denser bonding layer even under the same bonding conditions.

In addition, the sintering-inducing additive may be contained in an amount of about 2% by weight to 20% by weight, and preferably about 5% by weight to 10% by weight, based on the total weight of the metal paste.

Meanwhile, according to another embodiment of the present invention, a thermoelectric module including: a plurality of thermoelectric elements including a thermoelectric semiconductor; an electrode which is composed of a metal material and is connected between the thermoelectric elements; and a bonding layer in which the metal paste is sintered to bond the thermoelectric elements and the electrodes, may be provided.

As described above, the solder pastes that are conventionally used for bonding an electrode and a thermoelectric element have a limitation in driving a thermoelectric module in a high-temperature condition because of their low melting point. However, it was confirmed through experiments that the thermoelectric module which adopts a bonding technique using the metal paste of one embodiment including the low-melting point metal powder, the high-melting point metal powder, and the dispersing agent can be stably driven at a high temperature of 300° C. or higher, thereby completing the present invention.

The type of the thermoelectric element used in the thermoelectric module is not particularly limited. For example, a BiTe-based, a skutterudite-based, a silicide-based, a half-Heusler-based, a PbTe-based, a Si-based, and a SiGe-based thermoelectric semiconductor can be used.

Further, the material of the electrode used in the thermoelectric module is not particularly limited, and a material having high electrical conductivity generally used for a thermoelectric module can be used. For example, it may be composed of a material including at least one selected from the group consisting of nickel (Ni), copper (Cu), copper-molybdenum (Cu—Mo), silver (Ag), gold (Au), and platinum (Pt).

Furthermore, the thermoelectric module is formed as the metal paste of one embodiment is sintered, and includes a bonding layer which bonds the thermoelectric element and the electrode.

The bonding layer may be prepared by interposing the metal paste of one embodiment between the thermoelectric element and the electrode, followed by sintering. At this time, the sintering step may be carried out at a temperature of equal to or higher than the melting point of the second metal powder by a pressure sintering method that is well known to those skilled in the art.

Further, the bonding layer may be composed of a single phase of the intermetallic compound formed by the sintering process of the paste, or a mixed phase of the intermetallic compound and the first and second metals.

The bonding layer may further include transition metal particles in addition to the first and second metals in order to improve bonding performance and electrical and thermal properties.

In addition, the bonding layer may have porosity of about 10% or less, and preferably about 5% or less. At this time, the porosity is a ratio occupied by pores relative to the total area of the bonding layer as measured by a device such as a SEM, a TEM, and the like. The bonding layer shows low porosity of about 10% or less, and thus excellent mechanical bonding strength and high temperature reliability can be expected.

Moreover, the bonding layer may have bonding strength of about 1 MPa or more, preferably about 10 MPa or more, and more preferably 20 MPa or more. Herein, the bonding strength is measured as instantaneous shear strength when the device ruptures from the electrode by applying a shear force to the thermoelectric device using a bond tester (Nordson DAGE 4000).

Further, the bonding layer has resistivity of about 70 μΩ·cm or less at 50° C., about 80 μΩ·cm or less at 300° C., and about 90 μΩ·cm or less at 400° C.

Furthermore, the bonding layer has a thermal conductivity of about 10 W/m·k or more at 27° C., about 15 W/m·k or more at 300° C., and about 16 W/m·k or more at 400° C.

As the thermoelectric module includes the metal paste of one embodiment, it can be driven at a high temperature, can exhibit excellent thermoelectric performance, and can be preferably applied to a thermoelectric cooling system or thermoelectric powder generation system, etc., in various fields and uses.

Advantageous Effects

According to the present invention, a metal paste having excellent thermal and electrical properties and sufficient adhesive properties, and a thermoelectric module which adopts a bonding technique using the metal paste between a thermoelectric element and an electrode, may be provided.

DETAILED DESCRIPTION OF THE EMBODIMENTS

Hereinafter, the present invention will be described in more detail by way of examples. However, the examples are provided only for illustration of the invention, and the description of the present invention is not limited by the examples.

EXAMPLE 1

(1) 27.3% by weight of Ni μmpowder (0.6 μm), 66.7% by weight of Sn powder (5-10 μm), 1% by weight of sodium stearate, and 5.0% by weight of dihydro terpineol were mixed to prepare a metal paste.

(2) A thermoelectric module was prepared by using a skutterudite-based thermoelectric semiconductor as a thermoelectric material, and primary heat-drying the metal paste at 110° C. for 10 minutes, subjecting it to pressure (15 MPa) at 400° C. for 30 minutes, and bonding.

Figure 1:
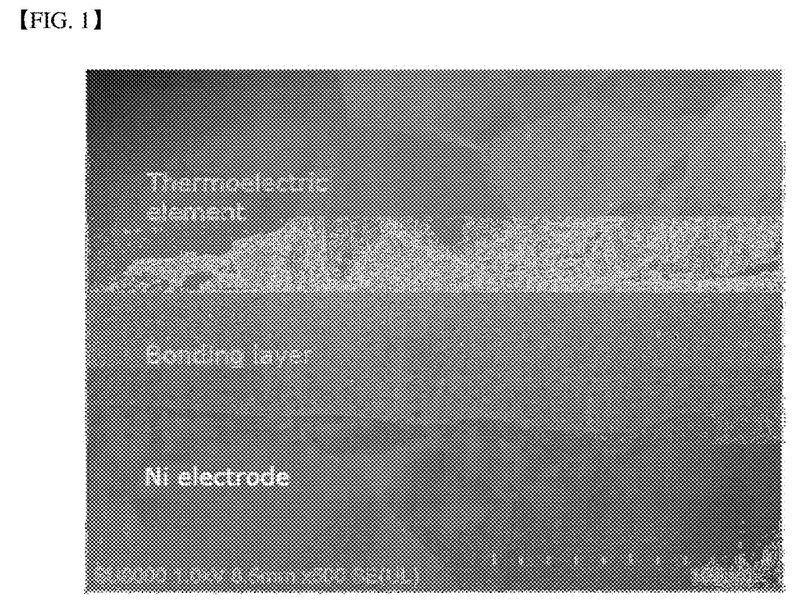
FIG. 1 shows a cross-sectional image of a thermoelectric module prepared in Example 1.

(3) At this time, the substrate size of the high-temperature portion of the thermoelectric module thus prepared was 30*30 mm, the substrate size of the low-temperature portion was 30*32 mm, and the size of the element was 3*3*2 mm, and the total number of the thermoelectric module is 32 pairs. The cross-section of the thus-prepared thermoelectric module was analyzed by SEM, and the analysis image thereof is shown in FIG. 1.

EXAMPLE 2

Figure 2:
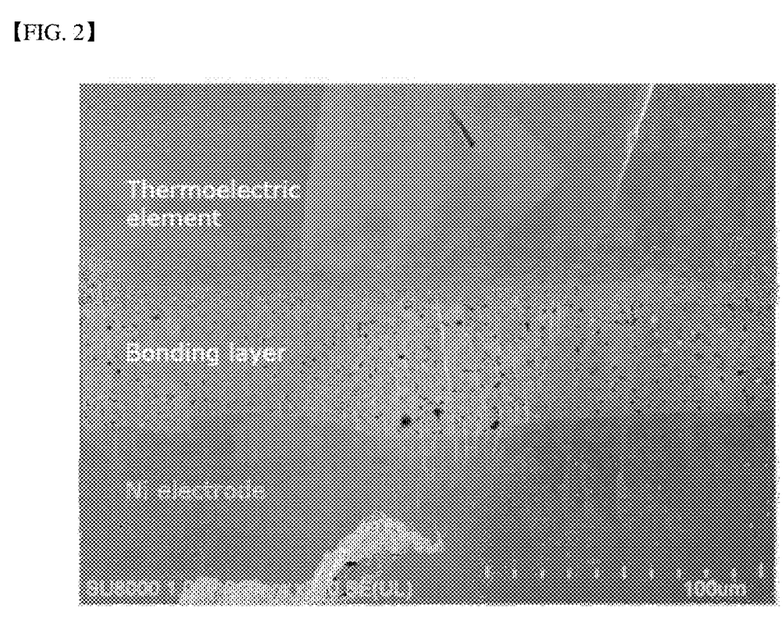
FIG. 2 shows a cross-sectional image of a thermoelectric module prepared in Example 2.

A thermoelectric module was prepared in the same manner as in Example 1, except that 27.5% by weight of Ni powder (0.6 μm), 67.5% by weight of Sn powder (2.5 μm), 1% by weight of oleylamine, and 4.0% by weight of dihydro terpineol were mixed to prepare a metal paste. The cross-section of the thus-prepared thermoelectric module was analyzed by SEM, and the analysis image thereof is shown in FIG. 2. cl COMPARATIVE EXAMPLE 1

A thermoelectric module was prepared in the same manner as in Example 1, except that 26.6% by weight of Ni powder (3 μm), 62.1% by weight of Sn powder (1 μm), 1.5% by weight of ethyl cellulose (binder resin), and 9.8% by weight of dihydro terpineol were mixed to prepare a metal paste.

Figure 3:
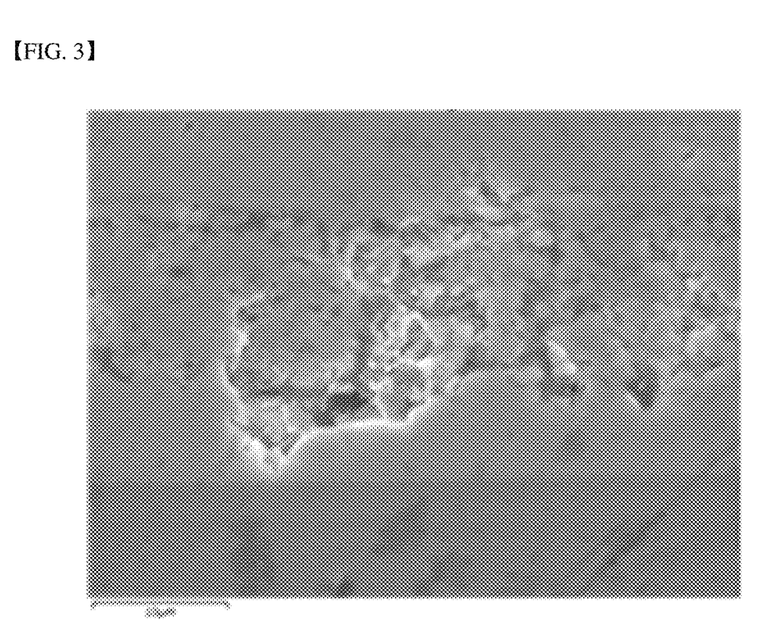
FIG. 3 shows a cross-sectional image of a thermoelectric module prepared in Comparative Example 1.

The cross-section of the thus-prepared thermoelectric module was analyzed by SEM, and the analysis image thereof is shown in FIG. 3. With reference to FIG. 3, the porosity of the bonding layer of Comparative Example 1 was about 24%, confirming that it showed high porosity.

Figure 4:
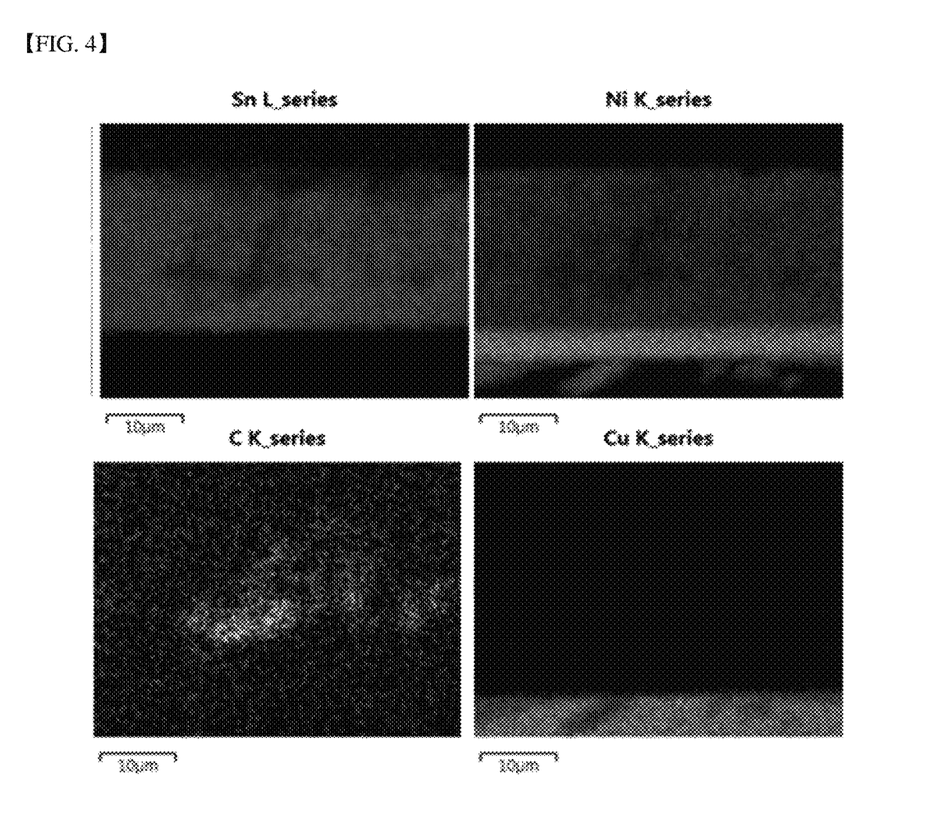
FIG. 4 shows images showing of elemental analysis of the cross-section of the thermoelectric module prepared in Comparative Example 1 through EDX (energy-dispersive X-ray spectroscopy).

In addition, the elemental analysis image of the cross-section of the thermoelectric module of Comparative Example 1 using EDX (energy-dispersive X-ray spectroscopy) is shown in FIG. 4. Referring to FIG. 4, it was confirmed that there was a considerable portion of residual carbon near the pores of the thermoelectric module of Comparative Example 1, which resulted in deteriorated sinterability of the metal compared to the examples, and accordingly, the bonding strength and the electrical/thermal properties of the bonding layer were not good.

COMPARATIVE EXAMPLE 2

A thermoelectric module was prepared in the same manner as in Example 1, except that 26.5% by weight of Ni powder (3 μm), 60.0% by weight of $Sn_{97.8}Ag_{1.9}Cu_{0.3}$ powder (2-7 μm), 1.5% by weight of ethyl cellulose (binder resin), and 12% by weight of dihydro terpineol were mixed to prepare a metal paste.

Figure 5:
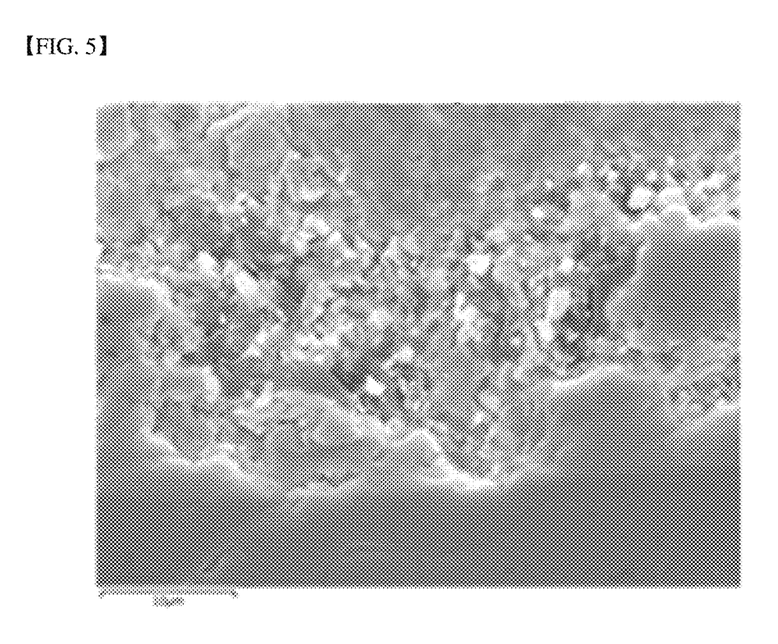
FIG. 5 shows a cross-sectional image of a thermoelectric module prepared in Comparative Example 2.

The cross-section of the thus-prepared thermoelectric module was analyzed by SEM, and the analysis image thereof is shown in FIG. 5. Referring to FIG. 5, it was confirmed that the bonding layer of Comparative Example 2 exhibited high porosity of about 41%.

Figure 6:
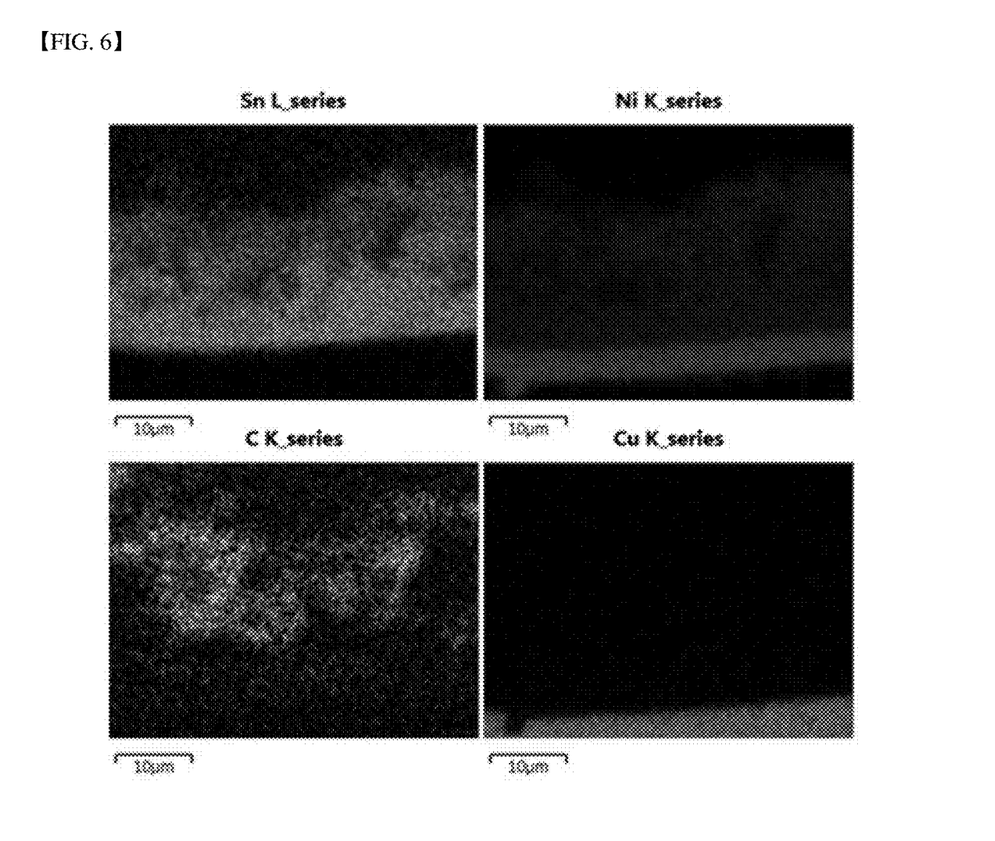
FIG. 6 shows images of elemental analysis of the cross-section of the thermoelectric module prepared in Comparative Example 2 through EDX (energy-dispersive X-ray spectroscopy).

In addition, the elemental analysis image of the cross-section of the thermoelectric module of Comparative Example 2 using EDX (energy-dispersive X-ray spectroscopy) is shown in FIG. 6. Referring to FIG. 6, as in the case of Comparative Example 1, the thermoelectric module of Comparative Example 2 also showed poor bonding strength and electrical/thermal properties of the bonding layer compared to the examples, due to a considerable amount of residual carbon present near the pores.

COMPARATIVE EXAMPLE 3

A thermoelectric module was prepared in the same manner as in Example 1, except that 27.4% by weight of Ni powder (0.3 μm), 64.6% by weight of Sn powder (1 μm), 1.4% by weight of ethyl cellulose (binder resin), and 6.6% by weight of dihydro terpineol were mixed to prepare a metal paste.

Figure 7:
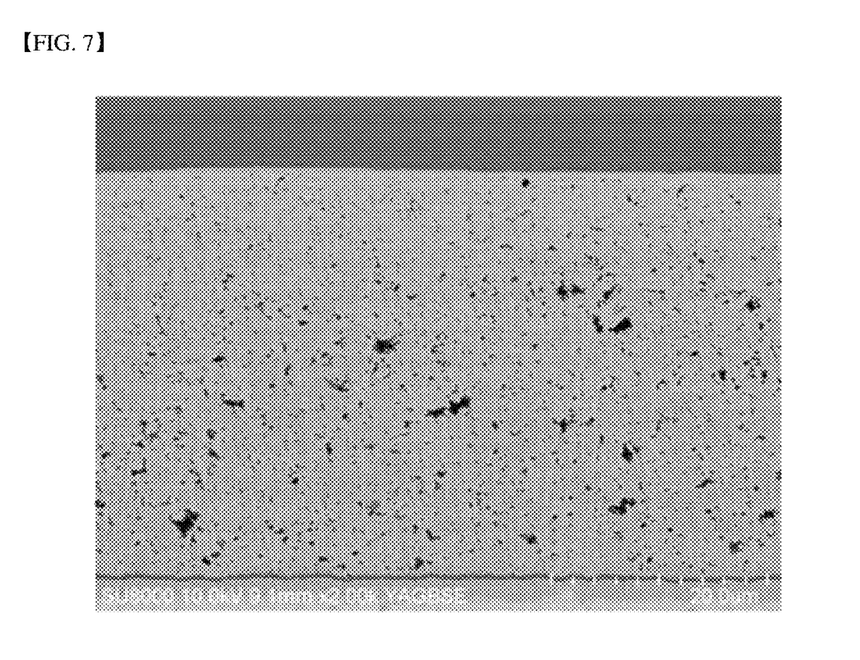
FIG. 7 shows a cross-sectional image of a thermoelectric module prepared in Comparative Example 3.

The cross-section of the thus-prepared thermoelectric module was analyzed by SEM, and the analysis image thereof is shown in FIG. 7. Referring to FIG. 7, the bonding layer of Comparative Example 3 exhibited porosity of about 2.6%, similar to that of the examples, but it was confirmed through an experimental example described below that the bonding strength and the electrical/thermal properties of the bonding layer were not good compared to the examples not using a binder resin.

COMPARATIVE EXAMPLE 4

A thermoelectric module was prepared in the same manner as in Example 1, except that 73% by weight of Ag powder (0.3 μm), 10.0% by weight of Sn powder (1 μm), 2.6% by weight of methyl methacrylate (binder resin), and 14.4% by weight of isophorone were mixed to prepare a metal paste.

A cross-sectional photograph of the thus-prepared thermoelectric module was printed out by using SEM, and the porosity of the bonding layer measured by analyzing particles using an image analysis program (Image J) was about 2.4%, showing a value similar to those obtained in the examples. However, it was confirmed through an experimental example described below that Comparative Example 4 had poor bonding strength of the bonding layer compared to those of the examples not using a binder resin.

COMPARATIVE EXAMPLE 5

A thermoelectric module was prepared in the same manner as in Example 1, except that 73% by weight of Ag powder (0.3 μm), 10.0% by weight of Zn powder (6-9 μm), 2.6% by weight of methyl methacrylate (binder resin), and 14.4% by weight of isophorone were mixed to prepare a metal paste.

EXPERIMENTAL EXAMPLE

The bonding layer resistivity, bonding strength, and bonding layer thermal conductivity of the thermoelectric modules prepared in Examples 1 and 2 and Comparative Examples 1 to 5 were measured by the following methods, and the results are shown in Tables 1 and 2 below.

(1) Bonding strength: Instantaneous shear strength when the device ruptures from the electrode by applying a shear force to the thermoelectric device while the thermoelectric device is attached to the substrate through the metal paste was measured using a bond tester (Nordson DAGE 4000).

(2) Porosity of bonding layer: Cross-sectional image of the bonding layer obtained by SEM was measured by analyzing particles using an image analysis program (Image J).

(3) Resistivity of bonding layer: Resistivity value according to temperature was measured by bringing the electrode into contact with the bonding material having a predetermined standard using a resistivity measuring device (Linseis LSR-3).

(4) Thermal conductivity of bonding layer: Thermal diffusivity and thermal conductivity according to temperature were each measured by irradiating the bonding material having a predetermined standard with a laser using a thermal conductivity measuring device (Netzsch LFA457).

TABLE 1

|  | Average bonding strength (MPa) | Porosity (%) |
|---|---|---|
| Example 1 | 39 | 1.8 |
| Example 2 | 22 | 2.7 |
| Comparative Example 1 | 12 | 24 |
| Comparative Example 2 | 10 | 41 |
| Comparative Example 3 | 18 | 2.6 |
| Comparative Example 4 | 11 | 2.4 |
| Comparative Example 5 | 6 | — |

TABLE 2

|  | Resistivity of bonding layer (μΩ · cm) | | | Thermal conductivity of bonding layer (W/m · k) | | |
|---|---|---|---|---|---|---|
|  | 50° C. | 300° C. | 400° C. | 27° C. | 300° C. | 400° C. |
| Example 1 | 61 | 76 | 85 | 12.4 | 16.6 | 17.2 |
| Example 2 | 49 | 60 | 72 | 16.6 | 21.7 | 21.6 |
| Comparative Example 1 | 75 | 91 | 98 | 10.1 | 13.7 | 14.3 |
| Comparative Example 2 | 77 | 98 | 109 | 11 | 14.3 | 14.6 |

Referring to Table 1, it was confirmed that, since the thermoelectric modules prepared in the examples had a high average bonding strength of 22 MPa and 39 MPa, they showed sufficient bonding properties compared to the thermoelectric modules of the comparative examples having a low bonding strength of 12 MPa, 10 MPa, 18 MPa, 11 MPa, and 6 MPa.

Further, referring to Table 2, it was confirmed that, since the thermoelectric modules prepared in the examples had a low bonding layer resistivity of 61 μΩ·cm, 76 μΩ·cm, and 85 μΩ·cm or less at 50° C., 300° C., and 400° C., respectively, they showed excellent electrical conductivity compared to the thermoelectric modules of the comparative examples having high resistivity.

Furthermore, it was confirmed that the thermoelectric modules of the examples had bonding layer thermal conductivity of 12.4 W/m·k, 16.6 W/m·k, and 17.2 W/m·k or higher at 27° C., 300° C., and 400° C., respectively, which were higher thermal conductivities compared to the thermoelectric modules of the comparative examples.

The invention claimed is:

1. A metal paste comprising: a first metal powder including nickel (Ni); a second metal powder including at least one selected from the group consisting of tin (Sn), zinc (Zn), bismuth (Bi), and indium (In); and a dispersing agent, wherein the metal paste does not contain a binder resin and wherein the first metal powder has an average particle diameter of 0.1 to 3.0 μm and the second metal powder has an average particle diameter of 0.5 to 10 μm.

2. The metal paste of claim 1, wherein the first metal powder further includes at least one selected from the group consisting of copper (Cu), iron (Fe), and silver (Ag).

3. The metal paste of claim 1, wherein a weight ratio between the first metal powder and the second metal powder is 15:85 to 90:10.

4. The metal paste of claim 1, wherein the dispersing agent is an alkali metal salt or an alkaline earth metal salt of an aliphatic acid having 12 to 20 carbon atoms.

5. The metal paste of claim 4, wherein the dispersing agent includes at least one selected from the group consisting of sodium stearate, stearic acid, oleic acid, oleylamine, palmitic acid, dodecanoic acid, sodium dodecanoate, and isostearic acid.

6. The metal paste of claim 1, wherein the dispersing agent is contained in an amount of 0.1% by weight to 5% by weight based on the total weight of the paste.

7. The metal paste of claim 1, further comprising a solvent having a boiling point of 150° C. to 350° C.

8. The metal paste of claim 7, wherein the solvent includes at least one selected from the group consisting of alcohols, carbonates, acetates, and polyols.

9. The metal paste of claim 1, further comprising a sintering-inducing additive.

10. The metal paste of claim 9, wherein the sintering-inducing additive is contained in an amount of 2% by weight to 20% by weight based on the total weight of the metal paste.

* * * * *